United States Patent [19]
Kurtz et al.

[11] Patent Number: 5,286,671
[45] Date of Patent: Feb. 15, 1994

[54] FUSION BONDING TECHNIQUE FOR USE IN FABRICATING SEMICONDUCTOR DEVICES

[75] Inventors: Anthony D. Kurtz, Teaneck; Alexander A. Ned, Bloomingdale, both of N.J.

[73] Assignee: Kulite Semiconductor Products, Inc., Leonia, N.J.

[21] Appl. No.: 58,400

[22] Filed: May 7, 1993

[51] Int. Cl.$^5$ .................................... H01L 21/306
[52] U.S. Cl. ..................... 437/64; 437/901; 148/DIG. 12
[58] Field of Search .............. 437/62, 63, 64, 65, 437/901, 925, 966, 974; 148/DIG. 12, DIG. 135, DIG. 150

[56] References Cited

U.S. PATENT DOCUMENTS

| | | | |
|---|---|---|---|
| 3,924,322 | 12/1975 | Kurtz et al. | 437/901 |
| 4,498,229 | 2/1985 | Wilner | 437/901 |
| 4,638,552 | 1/1987 | Shimbo et al. | 148/DIG. 12 |
| 4,672,354 | 6/1987 | Kurtz et al. | 437/901 |
| 5,238,865 | 8/1993 | Eguchi | 148/DIG. 12 |

Primary Examiner—Brian E. Hearn
Assistant Examiner—Chandra Chaudhari
Attorney, Agent, or Firm—Arthur L. Plevy

[57] ABSTRACT

A method of bonding a first silicon wafer to a second silicon wafer comprises the steps of diffusing a high conductivity pattern into a surface of a first semiconductor wafer, etching a portion of the surface to raise at least a portion of the pattern, providing a second semiconductor wafer having an insulating layer of a silicon compound disposed thereon, contacting the surface of the pattern to the insulating layer, and bonding the first and second semiconductor wafers at an elevated temperature.

16 Claims, 4 Drawing Sheets

FUSION BONDING TECHNIQUE FOR USE IN FABRICATING SEMICONDUCTOR DEVICES

BACKGROUND OF THE INVENTION

This invention relates to semiconductor devices in general and more particularly to semiconductor device isolation by wafer to wafer bonding.

It is known that two flat, smooth, hydrophilic surfaces can be bonded (or "contacted") at room temperature without the use of external forces. The bonded materials may be metallic, semiconducting, or insulating in nature. The contacting forces are believed to be caused by attraction between hydroxyl groups (—OH) and possibly some water molecules adsorbed on the two mating surfaces. This attraction causes the spontaneous formation of hydrogen bonds across the gap between two wafers. The spontaneity in the initiation of the contacting occurs only between exceptionally flat, smooth, and clean surfaces. Once initiated, this bonding process can spread in a form of "contacting wave" throughout the entire area between two silicon wafers with speeds of several cm/sec. The hydroxyl groups are usually attached to the surface through the reaction of a clean surface oxide with the moisture from the air or atomized water source.

The bonding of silicon wafers is one of the most promising techniques for the formation of silicon on insulator (SOI) wafers. Specifically, wafer bonding makes it possible to bury oxide and implantation layers within the bulk of a monocrystalline silicon wafer, and for this reason it has been utilized as a highly flexible and low cost alternative for SOI and epitaxial growth.

Currently, two basic approaches are employed in the fabrication of SOI wafers by wafer bonding, these differing primarily in the method of thinning the device (or seed) wafer, which is bonded to the substrate (or handle) wafer, to an appropriate device film thickness. In the first technique, a dielectric layer (such as $SiO_2$) is formed on the handle wafer. The polished face of the device wafer is contacted with that of the handle wafer in ambient temperature and atmosphere. A full strength seal is obtained by bonding the contacted wafers at a temperature of at least 1150° C. for at least one hour or greater. The bonded pair are precision lapped and polished from the device wafer side to the desired thickness of the silicon device layer. The resulting silicon film thickness uniformity is limited by the thickness uniformity of the handle wafer, which is on the order of 0.3 $\mu m^2$.

The second technique involves an etch back of the device wafer. A highly selective etch stop is formed by implantation, epitaxy or diffusion in the device wafer prior to bonding. As in the first technique, the polished face of the device wafer is contacted with that of the handle wafer in ambient temperature and atmosphere and the pair are bonded at 1150° C. for an hour. The bonded wafers are subjected to an etching process from the device wafer side in which almost all of the device wafer is removed, thereby leaving a thin device layer which is subsequently patterned and etched using conventional photolithography.

A principal disadvantage of the above techniques, however, is the difficulty in uniform sealing at the interface of the mated wafers due to the presence of bubbles and voids. Interface bubbles are caused by dust particles and insufficient wafer flatness. While the latter problem can be avoided by appropriate wafer specification, it is extremely difficult to obtain totally dust-free wafer surfaces prior to the bonding procedure. In an article appearing in Vol. 27, No. 12 of the Japanese Journal of Applied Physics (1988), R Stengl et al. reported that even for wafers mated in a class 1 cleanroom, about 70% of the wafers contained one or more bubbles due to dust particles less than 1 micron in diameter.

An additional disadvantage of such techniques is the interval of time required to obtain a high reliability, full strength seal between the mating surfaces. As indicated above, sealing by prior art techniques requires at least one hour at 1150° C. or greater to obtain a full strength seal.

Yet another disadvantage of such techniques is that the implantation or diffusion layer must be etched to form the desired circuit pattern after the etch back of the non-bonded surface of the device wafer. As a result, fine line patterns, which are desired in certain pressure transducer applications or very large scale integration applications, can not be obtained due to limitations in the etching process.

Accordingly, it is a principal object of the present invention to provide a method of forming silicon on insulator (SOI) wafers by fusion bonding which avoids the aforementioned problems associated with the prior art.

SUMMARY OF THE INVENTION

A method of fabricating silicon on insulator wafers by fusion bonding two silicon wafers comprises the steps of defining the desired circuit patterns by a prediffusion and etching process prior to contacting and bonding the device and handle wafers. The desired circuit patterns are prediffused through a thin oxide layer grown on the surface of the device wafer. The device wafer is etched to elevate the circuit patterns and the oxide layer is stripped. A second diffusion step is performed in which a thin layer of a boron glass compound is defined on the surface of the circuit patterns. The surface of the device wafer having the pattern thereon is contacted with the polished, oxidized surface of the handle wafer and the contacted wafers are bonded at elevated temperature. An etch back of the device wafer is performed to provide a silicon on insulator wafer having the desired circuit patterns already dielectrically disposed thereon.

The use of prepatterned, raised thin-lined structures gives rise to higher stresses at the bond interface and permits full strength bondings at significantly lower times and temperatures than in the prior art. Also, the preraising of the contacted area on the seed wafer obviates the need for ultra clean conditions to insure full strength bonding.

DETAILED DESCRIPTION OF THE INVENTION

Before proceeding with the detailed description, it should be understood that although the specification will make reference to a piezoresistive transducer in which piezoresistive elements are incorporated in a bridge configuration on a substrate, the inventive technique for fusion bonding two silicon wafers described herein is not to be limited to transducer devices and may, in fact, be utilized to fabricate SOI wafers for a wide variety of electronic devices, including power devices and sensors generally.

Figure 1:
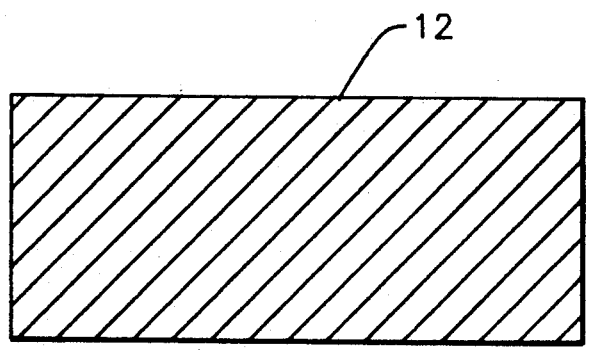
FIG. 1 is a cross sectional view of a silicon wafer used to form a device wafer to be bonded in accordance with the technique of the present invention.
Figure 2:
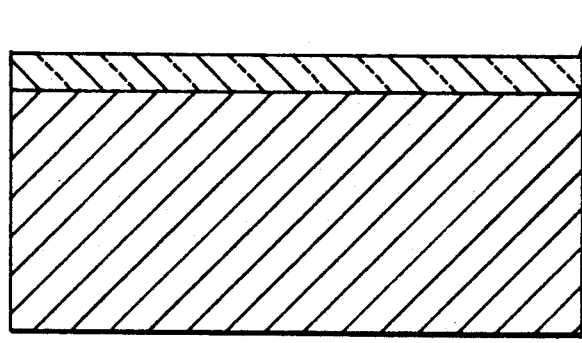
FIGS. 2–6 are cross sectional views illustrating various process steps of fabricating a device wafer in accordance with one embodiment of the inventive method.

With reference now to FIG. 1, there is shown a cross sectional view of a treated device wafer 10. The original device wafer 10 may be fabricated from a semiconductor material, such as N-type silicon, and is preferably a single crystal structure. The wafer may be circular or rectangular in the top plan view. Essentially, such wafers are commercially available and are well known in the art. According to the first method to be described, the surface 12 of wafer 10 is polished or lapped to a smooth finish. The polishing step is such as to almost produce an optical flat. The wafer 10 is then treated so that an oxide layer 14, which may be 5000 angstroms thick, is grown on a surface thereof, as shown in FIG. 2. The growth of oxide layers on silicon substrates is well known in the art and is described in many references. A typical technique for providing an oxide layer on a silicon substrate is implemented by heating the wafer 10 to a temperature between 1000°-1300° C. and passing oxygen over the surface of the substrate.

Figure 3:
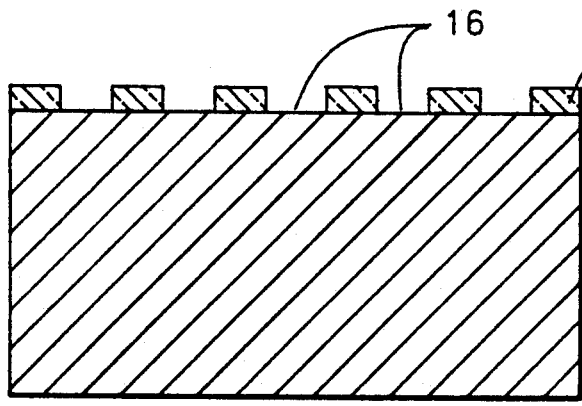

With reference now to FIG. 3, it can be seen that the desired device patterns 20 are now defined in the oxide layer wafer 14. This is accomplished by the use of photolithography, a well known technique in the semiconductor art. Briefly, the photolithographic technique involves the preferential removal of the oxide layer 14 by spreading a uniform photosensitive film over the oxide, masking portions of the film and exposing the assembly to ultraviolet radiation. The exposed portion of the film becomes insoluble, whereas the masked portion is soluble in a developing film. The oxide in those areas where the film has been removed can now be removed by etching in hydrofluoric acid, thus providing openings 16 in the oxide layer corresponding to the desired patterns.

Figure 4:
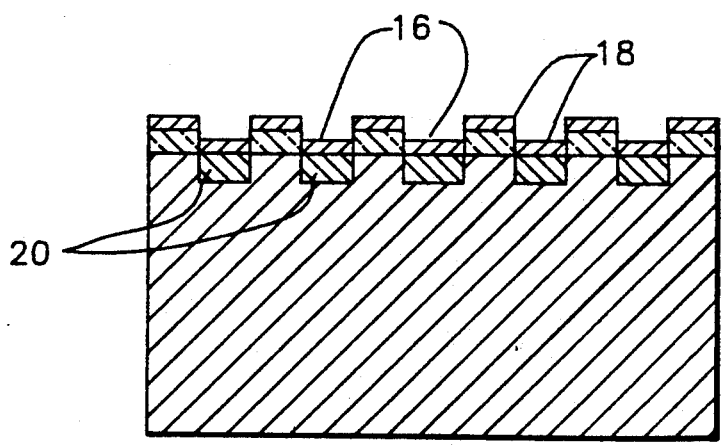

As shown in FIG. 4, the substrate is again oxidized to form an additional oxide layer 18, which may be on the order of 1000 angstroms, over oxide layer 14 and the etched openings 16. It is well known that one may diffuse various impurities into a silicon wafer through an $SiO_x$ layer. Thermal oxides are very smooth and, unlike most of the deposited films, their microroughness is not detectable by stylus profilometry or Normarsky optical microscopy. The desired device patterns, which for purposes of illustration are piezoresistive bridge patterns 20, are predefined by degenerately prediffusing a P-type impurity such as boron through the openings 16 and the thin oxide layer 18 into the N-type device wafer 10. This may be accomplished by diffusing $B_2H_6$ into the device wafer 10 for approximately 30-35 minutes at 1150° C., which results in a sheet resistivity of about 5-10 ohms per square.

As is well known, semiconductor transducers typically employs one or more piezoresistive elements which are mounted or diffused in a bridge pattern of resistors on a thin diaphragm member. The diaphragm member, which may be fabricated from silicon, flexes upon application of force thereto and thereby causes fiber stresses on the top surface. These stresses elongate or shorten the piezoresistors and cause them to vary their resistance according to the deflection of the diaphragm. Reference may be had to U.S. Pat. No. 4,498,229 entitled PIEZORESISTIVE TRANSDUCER, issued on Feb. 12, 1985 to Leslie B. Wilner and to U.S. Pat. No. 4,672,354 entitled FABRICATION OF DIELECTRICALLY ISOLATED FINE LINE SEMICONDUCTOR TRANSDUCERS AND APPARATUS, issued on Jun. 9, 1987 to Anthony D. Kurtz et al., assigned to the assignee herein, as illustrative examples of piezoresistive transducer construction. It is, of course, understood, that many pattern configurations can be accommodated on a silicon wafer 50, strictly dependent upon wafer size and bridge dimensions. Each pattern 20 is representative of a bridge configuration, by way of example, and contains four piezoresistive elements to form a typical Wheatstone bridge configuration.

W. P. Maszara, in an article appearing in Vol. 138, No. 1 of the Journal of the Electrochemical Society (1991), observed that because the surface roughness of silicon increases with the thickness of an $SiO_2$ layer grown on it (for a given temperature), it is reasonable to expect that the oxide surface should also become rougher with the increasing thickness. Accordingly, by utilizing the thin oxide layer 18, the pre-diffusion can be performed while preserving the requisite smoothness of the device wafer surface.

In accordance with the technique of the present invention, the patterns which define the illustrative piezoresistive elements may be extremely fine line patterns, as may be implemented by diffusion, having a width of 0.1 to 1.0 mils. Such patterns can be accurately controlled due to advances made in the diffusion process, and further, the use of diffusion controls the spreading of line widths.

Figure 5:
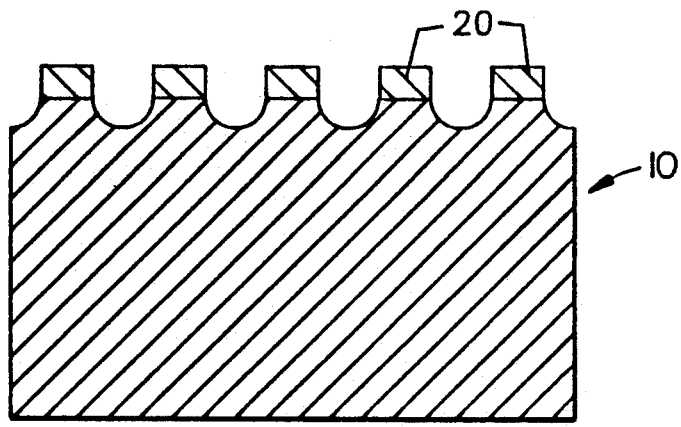

Referring to FIG. 5, the next step in the procedure is depicted. After formation of the degenerately doped, pattern defining regions on the wafer 10, the oxide layers 14 and 18 are removed and the N-type silicon wafer 10 is etched to reduce the thickness at the top surface. The etching is done by a conductivity selective etch. Such etches are well known, and there are etchants such as hydrazine which selectively attack the low conductivity N-type material without etching or in any manner attacking the high conductivity P+ regions. The techniques for etching silicon are well known in the art.

Figure 6:
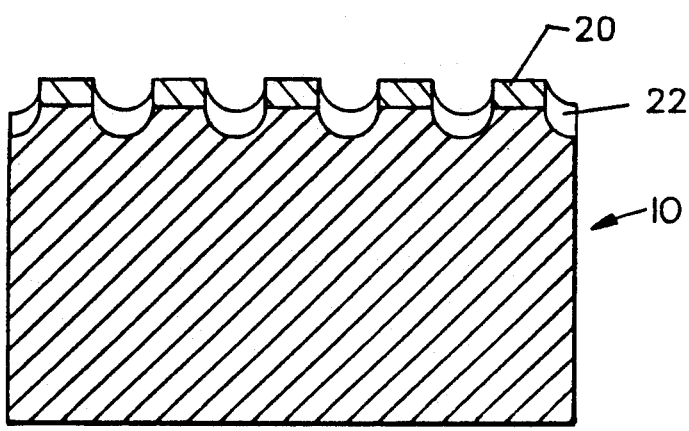

According to the method, the material from the N-type wafer 10 is etched away to a depth of approximately 1 micron to produce the structure shown in FIG. 5. With reference to FIG. 6, it can be seen that a layer of quartz 22, which may be on the order of 1000 to 2000 angstroms thick, is sputtered or otherwise formed on the surface of the device wafer. When referring to quartz, it is understood that silicon dioxide is equivalent. An opening 28 similar to that used in the prediffusion step is provided in the quartz layer 22 by preferential masking and etching of the quartz layer in accordance with conventional photolithographic procedures.

Preferably, the pattern is re-diffused for 3-4 minutes at 1150° C. by degenerate doping of the wafer with $B_2H_6$. This second diffusion not only acts as an additional dopant source, but also forms a shallow layer of $B_2O_3$ glass over the device pattern. The presence of the $B_2O_3$ layer has been found to enhance sealing and to improve the overall quality of the bond.

Figure 7:
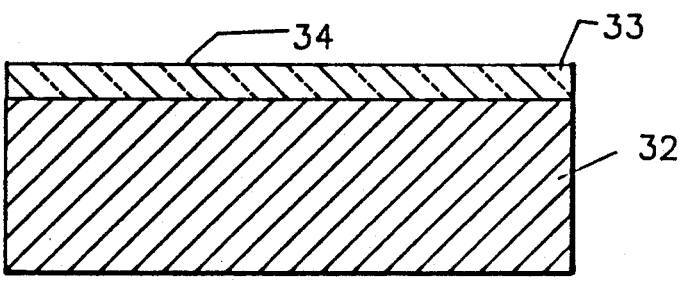
FIG. 7 is a cross sectional view of a polished oxidized handle wafer which may be bonded to a device wafer fabricated in accordance with the inventive method to produce a silicon on insulator wafer.
Figure 8:
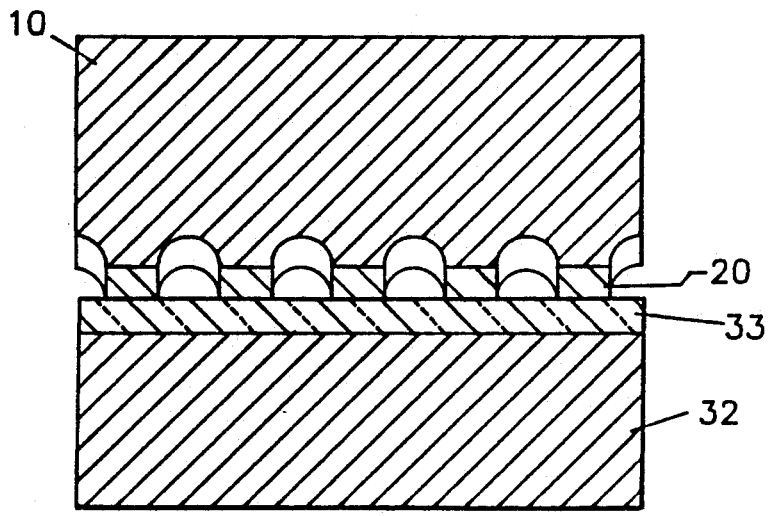
FIG. 8 is a cross sectional view showing a device wafer which has been fusion bonded to a handle wafer in accordance with the inventive method.

The surface 30 of the fabricated device wafer 10 is then hydrated using a chemical cleaning procedure. Such surface treatments, which are well known, are used to improve the hydrophilic properties of the oxide surface and include ammonium hydroxide soaking, sulfuric acid, $NH_3$ plasma, and other techniques. As shown in FIG. 7, a handle wafer 32, which is preferably fabricated from a single crystal silicon material, is prepared by polishing or lapping a surface thereof to a smooth finish. The polishing step is such as to almost produce an optical flat. A thin layer of oxide 33, on the order of several thousand angstroms may be thermally grown on the polished surface of the handle wafer if desired, depending upon the final dielectric layer thickness required by the device application. The oxidized surface 34 of handle wafer 32 is subjected to the same chemical cleaning procedure as the device wafer 10, and thereafter the two wafers are contacted as shown in FIG. 8. Employing the inventive method, it has been found that a reliable, full strength seal may be obtained by bonding the wafers at a temperature at or below 1000° C. (as low as 900° C.) for times on the order of minutes such as 5 to 10 minutes.

Figure 9:
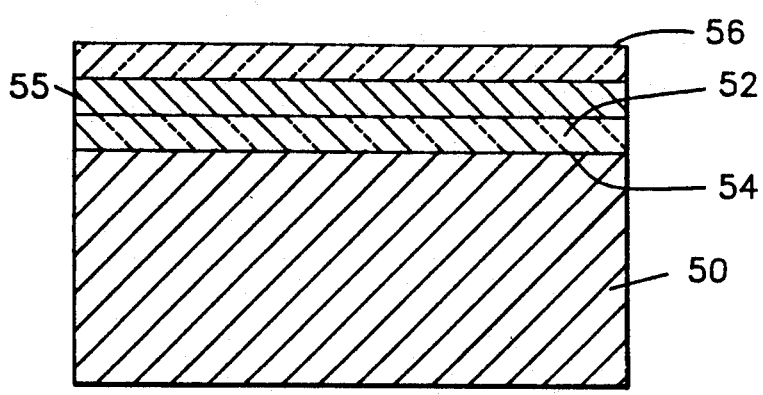
FIGS. 9-15 are cross sectional views depicting a process for fabricating a device wafer for fusion bonding in accordance with another embodiment of the present invention.

A second method according to this invention is very similar to the technique above described and is best described with reference to FIG. 9. In FIG. 9, an oxide layer 52, which is on the order of 1000 angstroms thick, is thermally grown or otherwise provided on the polished surface 54 of a single crystal silicon device wafer 50. The wafer is then treated to form a layer of silicon nitride 55 over the oxide layer. The layer of nitride may be 2,000 angstroms thick. On top of the layer of silicon nitride is deposited a layer of silicon dioxide 56. This may give a layer of silicon dioxide of between 1,000 to 3,000 angstroms. It is noted that both the growth or deposition of silicon nitride and silicon dioxide are well known. It is also well known that there are etches which will attack silicon dioxide and not silicon nitride and vice versa. For example, one can utilize a buffered solution of hydrogen fluoride (HF) for attacking silicon dioxide and utilize a mask of silicon nitride to selectively prevent etching of the silicon dioxide. Alternatively, one employs phosphoric acid for etching silicon nitrite utilizing a mask of silicon dioxide. Thus, the phosphoric acid will attack the silicon nitride but will not attack the silicon dioxide.

Figure 10:
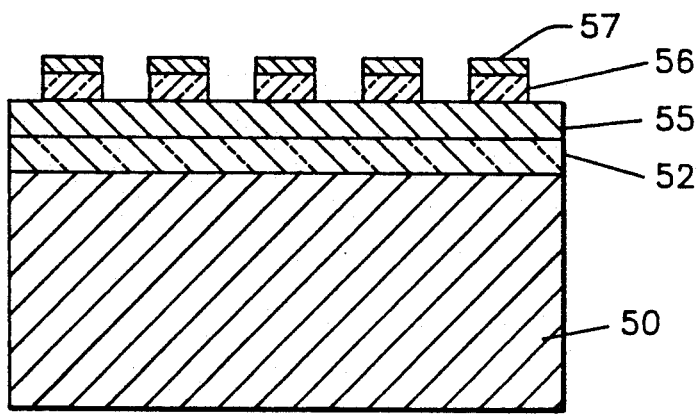
Figure 11:
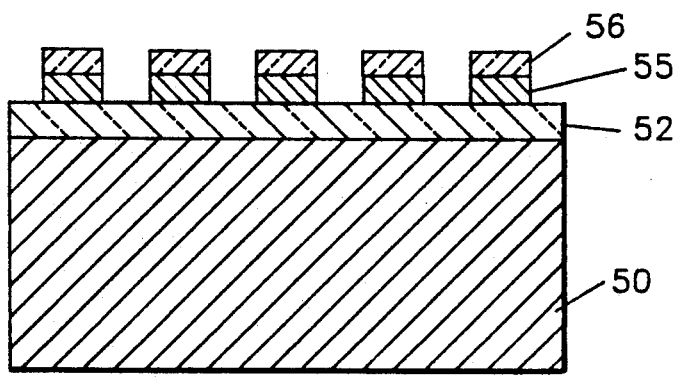

A layer of photoresist 57 is deposited on top of the layer of silicon dioxide. The layer of photoresist is patterned to form a photoresist pattern in the photoresist layer. The resultant pattern is shown in FIG. 10 after etching away the unwanted silicon dioxide. Thus, as shown in FIG. 10, a line pattern which consists of the photoresist deposited or otherwise bonded to the remaining portion of the layer of silicon dioxide. The photoresist is now stripped leaving the layer of silicon dioxide 56 secured to the layer of silicon nitride 55. The nitride is then patterned based on using the silicon dioxide as a mask, thus arriving at the structure of FIG. 11 which shows a line of silicon nitride secured to the oxide layer 52.

Figure 12:
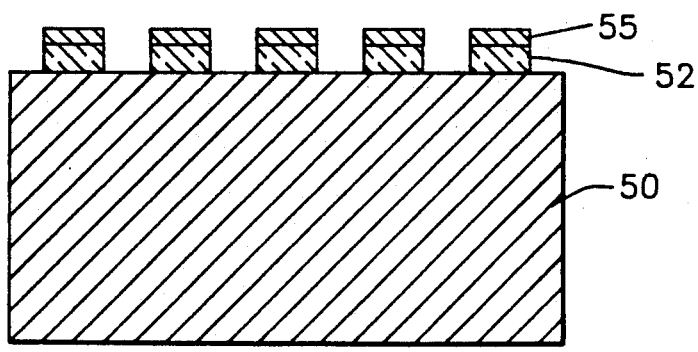
Figure 13:
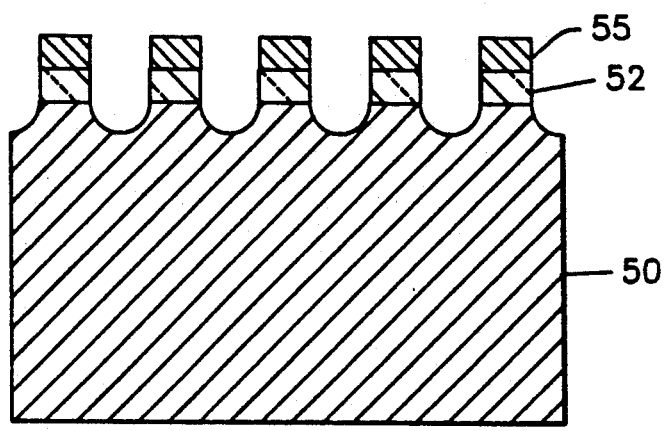
Figure 14:
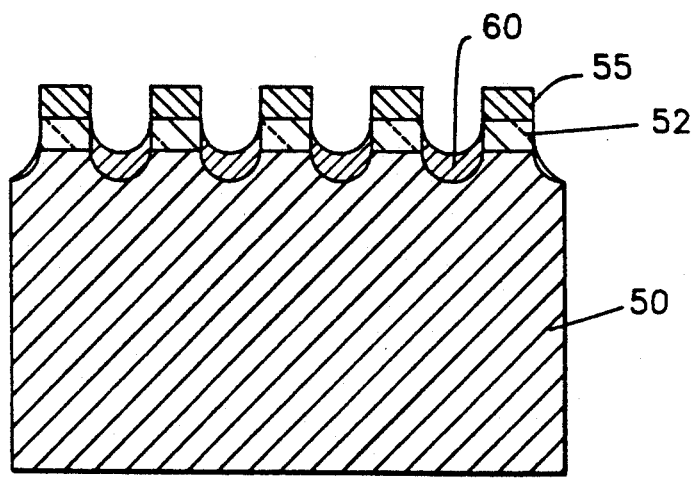

As shown in FIG. 12, the next step in the procedure is to strip all oxide, including the remaining portions of layer 56 and any portions of the oxide layer 52 not masked by the silicon nitride pattern. With reference to FIG. 13, it can be seen that the N-type silicon wafer 50 is now etched to raise the line pattern defined by the silicon nitride mask. Etches for this purpose are well known, and may include dilute solutions of $I_2$ or KOH. As shown in FIG. 14, an oxide coating 60 is then thermally grown over the entire wafer 50. It is noted that the oxide will not grow on the silicon nitride.

Figure 15:
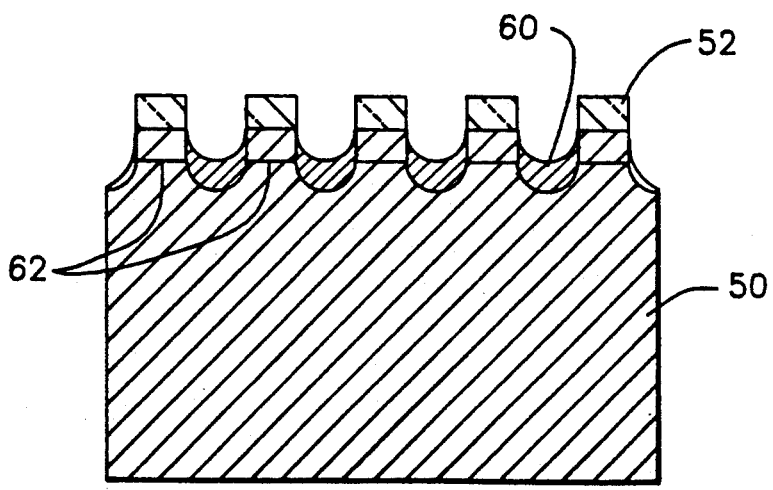

With reference now to FIG. 15, it can be seen that the silicon nitride is then stripped, leaving a line pattern defined by the thin oxide layer 52. $B_2H_6$ or some other p-type impurity is pre-diffused through the oxide layer 52 to establish a degenerate condition in the wafer corresponding to the desired circuit patterns. The exterior oxide coating, which may be on the order of 10,000 angstroms, prevents the boron from diffusing into the coated areas.

Once the diffusion is completed, the thin oxide layer is stripped and another diffusion of $B_2H_6$ is performed. As in the first technique, this second diffusion activates the surface of the pattern with a thin skin of $B_2O_3$ glass, which has been shown to enhance the quality of the bond.

The fabricated device wafer 50 is bonded to the handle wafer in a manner identical to that described in connection with the first method.

Once the handle and device wafers have been bonded utilizing either of the inventive techniques set forth above, the device wafer is separated utilizing a selective etch technique, leaving only the p+ pattern dielectrically isolated by an $SiO_2$ layer from the underlying silicon substrate.

When the aforementioned inventive techniques are utilized to fabricate a dielectrically isolated transducer structure, the bonded wafer can be patterned for contacts and the diaphragms can be defined by etching the other side of the wafer. The wafer may then be scored to obtain the individual transducer circuits.

While the foregoing has described one technique for fabricating a silicon on insulator device wafer utilizing a predefined area for bonding, it is envisioned that further equivalent configurations, modifications, and alternate embodiments may be suggested to those knowledgeable in the art. For example, the technique may be utilized to dielectrically isolate other types of circuits besides transducers from an underlying substrate by diffusing such circuits prior to bonding. An advantage is that because of the low temperature and short times at which bonding takes place, the diffused patterns retain their concentration profiles. Accordingly, such alternate embodiments are to be construed as being within the spirit of the present invention, even though not explicitly set forth herein, the present invention being limited only by the content and scope of the claims appended hereto.

What is claimed is:

1. A method of bonding a first silicon wafer to a second silicon wafer comprising the steps of:
   diffusing a high conductivity pattern into a surface of a first semiconductor wafer;
   etching a portion of said surface to raise at least a portion of said pattern;

providing a second semiconductor wafer having an insulating layer of a silicon compound disposed thereon;

contacting the surface of said pattern to said insulating layer; and bonding said first and second semiconductor wafers at an elevated temperature.

2. The method according to claim 1, wherein said high conductivity pattern is diffused through a thin layer of an insulating silicon compound.

3. The method according to claim 2, further comprising the step of stripping said thin layer and re-diffusing said high conductivity pattern.

4. The method according to claim 3 wherein said stripping step is performed prior to said etching step.

5. The method according to claim 3, wherein said re-diffusing step is performed by diffusing boron into said first semiconductor wafer, thereby forming a thin layer of $B_2O_3$ glass over said pattern.

6. The method according to claim 1, wherein said pattern comprises a circuit pattern.

7. The method according to claim 6, wherein said circuit pattern is a piezoresistive bridge pattern.

8. The method according to claim 7, wherein said pattern is a power circuit pattern.

9. The method according to claim 6, further including the step of etching a surface of said first wafer so that said circuit pattern projects from said first semiconductor wafer.

10. The method according to claim 1, wherein said first and second wafers are bonded at said elevated temperature for less than 15 minutes.

11. A method of fabricating a piezoresistive semiconductor structure for use in a transducer comprising the steps of:

diffusing a piezoresistive pattern into a surface of a first semiconductor wafer;

etching a portion of said surface to raise said piezoresistive pattern;

providing a second semiconductor wafer having an insulating layer of a silicon compound disposed thereon;

contacting the surface of said pattern to said insulating layer; and bonding said first and second semiconductor wafers at an elevated temperature.

12. The method according to claim 11, wherein said piezoresistive pattern is diffused through a thin insulating layer of a silicon compound of said first semiconductor wafer.

13. The method according to claim 12, further comprising the step of stripping said thin insulating layer and re-diffusing said pattern.

14. The method according to claim 13 wherein said stripping step is performed prior to said etching step.

15. The method according to claim 13, wherein said re-diffusing step is performed by diffusing boron into said first semiconductor wafer, thereby forming a thin layer of $B_2O_3$ glass over said piezoresistive pattern.

16. The method according to claim 10 where the elevated temperature is at as low as 900° C. to 1000° C.

* * * * *